United States Patent [19]
Chen et al.

[11] Patent Number: 5,808,342
[45] Date of Patent: Sep. 15, 1998

[54] BIPOLAR SCR TRIGGERING FOR ESD PROTECTION OF HIGH SPEED BIPOLAR/BICMOS CIRCUITS

[75] Inventors: Julian Zhiliang Chen, Dallas; Ajith Amerasekera, Plano; Thomas A. Vrotsos, Richardson, all of Tex.

[73] Assignee: Texas Instruments Incorporated, Dallas, Tex.

[21] Appl. No.: 721,067

[22] Filed: Sep. 26, 1996

[51] Int. Cl.$^6$ .................................................. H01L 23/62
[52] U.S. Cl. ...................... 257/357; 257/176; 257/356; 257/358; 257/359; 257/362; 257/363; 257/546
[58] Field of Search .................................. 257/141, 173, 257/357, 358, 359, 362, 363, 546

[56] References Cited

U.S. PATENT DOCUMENTS

| | | | |
|---|---|---|---|
| 5,102,811 | 4/1992 | Scott | 437/31 |
| 5,341,005 | 8/1994 | Canclini | 257/173 |
| 5,343,053 | 8/1994 | Avery | 257/173 |
| 5,545,909 | 8/1996 | Williams et al. | 257/355 |

FOREIGN PATENT DOCUMENTS 60-219769  11/1985  Japan .

OTHER PUBLICATIONS

Z. Chen et al., *Bipolar SCR ESD Protection Circuit for High Speed Submicron Bipolar/BiCMOS Circuits*; IEDM, Dec. 1995 (International Electron Devices Meeting), pp. 337–340.

*Primary Examiner*—Mahshid D. Saadat
*Assistant Examiner*—Allan R. Wilson
*Attorney, Agent, or Firm*—Jacqueline J. Garner; Wade James Brady, III; Richard L. Donaldson

[57] ABSTRACT

The invention provides a Bipolar structure such as a silicon controlled rectifier (SCR) that exhibits advantageously low triggering and holding voltages for use in high speed (e.g., 900 MHz–>2 GHz) submicron ESD protection circuits for Bipolar/BiCMOS circuits. The Bipolar structure features a low shunt capacitance and a low series resistance on the input and output pins, allowing for the construction of ESD protection circuits having small silicon area and little to no impedance added in the signal path. In a preferred aspect of the invention, the SCR is assembled in the N-well of the Bipolar/BiCMOS device, as opposed to the P-substrate, as is customary in the prior art. A preferred aspect of the invention utilizes a Zener diode in combination with a resistor to control BSCR operation through the NPN transistor. The turn-on voltage of the Zener is selected so as to be comparable to the emitter-base breakdown voltage of the NPN structure, which is only slightly higher than the power supply voltage to ensure that the ESD protection circuit will not be triggered under normal circuit operation. A forward diode string can optionally be added in series with the Zener to increase circuit trigger voltage, particularly in instances where the power supply voltage exceeds the Zener breakdown voltage. During an ESD event, when pad voltage exceeds Zener breakdown voltage, the Zener breaks down, and current flows through an associated (polysilicon) resistor to trigger the NPN of the Bipolar SCR and thus activate the BSCR to conduct the High ESD current from the associated, protected circuit.

11 Claims, 3 Drawing Sheets

BIPOLAR SCR TRIGGERING FOR ESD PROTECTION OF HIGH SPEED BIPOLAR/ BICMOS CIRCUITS

FIELD OF THE INVENTION

This invention relates generally to electronic circuits, and more particularly to electrostatic discharge (ESD) protection circuits for Bipolar/BiCMOS circuits.

BACKGROUND OF THE INVENTION

The use of electrostatic discharge (ESD) protection circuits to protect input and output circuitry from ESD is well known, as taught in prior art U.S. Pat. No. 5,268,588; U.S. Pat. No. 4,896,243; U.S. Pat. No. 5,077,591; U.S. Pat. No. 5,060,037; U.S. Pat. No. 5,012,317; U.S. Pat. No. 5,225,702 and U.S. Pat. No. 5,290,724 all assigned to Texas Instruments Incorporated, the assignee herein. ESD protection circuits for Bipolar/iCMOS technologies need to be able to protect the pull-down NMOS transistor in CMOS output buffers as well as the collector-base junction in NPN output transistor and the emitter-base junctions of emitter coupled logic (ECL) devices. The protection circuit is operable to turn-on at voltages that are lower than the trigger and holding voltages of their associated devices. The ESD protection circuit should also contribute minimal capacitance and require minimal surface area in order to be effective.

Many ESD protection circuits utilize a two stage protection scheme on circuit inputs as shown in prior art FIG. 1. Typically, the high current pulse of an ESD strike passes through the primary clamp, which clamps the pad voltage. However, this is still too high a voltage for the circuitry to receive, therefore the secondary clamp clamps the voltage to a safe value. The current limit structure restricts the current flow so that the secondary clamp does not have to be excessively large.

Present state-of-the art BiCMOS processes use NPN or SCR (silicon controlled rectifier) devices for ESD protection circuits. SCR devices designed for Bipolar circuits typically exhibit higher trigger voltages and comparable, or even lower, holding voltages as NPN transistors. As complimentary oxide semiconductor (CMOS) processes evolve to transistor shorter channel lengths and gate oxides, it becomes more difficult to protect both input and output circuits from damage due to electrostatic discharge.

High speed submicron Bipolar/BiCMOS circuit applications impose tight constraints on ESD protection circuits. Essential requirements are low shunt capacitance and low series resistance on input and output pins, which means that ESD protection circuits should require minimal silicon space and contribute virtually no impedance to the signal path. Trigger voltages ($V_t$) and clamp voltages ($V_{clamp}$) should also be below the "turn-on" (i.e., activation) voltages of the circuits being protected. NPN transistor ESD protection schemes have limitations for such systems. FIG. 2 graphically illustrates pulsed current-voltage curves of a 100 $\mu$m wide NPN transistor in 0.6 $\mu$m and 0.8 $\mu$m processes, for which the $V_{clamp}$ is 10 volts at 1.3 amp for 0.6 $\mu$m processes and 13 volts at 1.3 amp for 0.8 $\mu$m processes. These levels are too high to protect Bipolar/MOS input and output buffers as well as emitter coupled logic (ECL) devices in advanced submicron technologies. The high clamping voltage of the NPN structure is attributed to its high holding voltage ($V_h$) and the on-resistance value. In submicron Bipolar/iCMOS processes, a protection NPN structure is normally operable in the avalanche mode in order to conduct the high ESD current. For a given process, setting of the $BV_{ceo}$ (breakdown at collector-emitter junction, base "open") therefore establishes the lower limit of the clamping voltage $V_{clamp}$. Clamp voltage can be lowered by lowering the on-resistance value, which can be accomplished by using larger NPN structures and higher capacitance loading. However, such approaches are not applicable to high speed submicron Bipolar/BiCMOS processes, since a large shunt capacitance will create an electrically "shorted" path for high frequency signal input and output.

In view of the foregoing deficiencies, it would be desirable to provide circuit configurations that enable BSCR protection circuits with high ESD performance which meet the foregoing requirements of reduced triggering and holding voltages for high speed circuit applications. It would be particularly advantageous to provide a Bipolar SCR protection circuit that can be fabricated in a submicron BiCMOS in the absence of additional masks for circuit implementation.

SUMMARY OF THE INVENTION

The invention provides a Bipolar structure such as a silicon controlled rectifier (SCR) that exhibits advantageously low triggering and holding voltages for use in high speed (e.g., 900 MHz–>2 GHz) submicron ESD protection circuits for Bipolar/BiCMOS circuits. The Bipolar structure features a low shunt capacitance and a low series resistance on the input and output pins, allowing for the construction of ESD protection circuits having small silicon area and little to no impedance added in the signal path. In a preferred aspect of the invention, the SCR is assembled in the N-well of the Bipolar/BiCMOS device, as opposed to the P-substrate, as is customary in the prior art. Moreover, a $P^+$ anode implant can be provided that can be accomplished in the absence of additional mask patterning steps.

A preferred aspect of the invention utilizes a Zener diode in combination with a resistor to control BSCR operation through the NPN transistor. The turn-on voltage of the Zener is selected so as to be comparable to the emitter-base breakdown voltage of the NPN structure, which is only slightly higher than the power supply voltage to ensure that the ESD protection circuit will not be triggered under normal circuit operation. A forward diode string can optionally be added in series with the Zener to increase circuit trigger voltage, particularly in instances where the power supply voltage exceeds the Zener breakdown voltage. During an ESD event, when pad voltage exceeds Zener breakdown voltage, the Zener breaks down, and current flows through an associated (polysilicon) resistor to trigger the NPN of the Bipolar SCR and thus activate the BSCR to conduct the High ESD current from the associated, protected circuit.

BRIEF DESCRIPTION OF THE DRAWINGS

Further features and advantages of the present invention will become apparent from a reading of the specification in conjunction with the drawings, for which like reference characters represent corresponding parts throughout the various views and in which certain aspects of the depicted structures have been exaggerated for clarity, in which.

DETAILED DESCRIPTION OF THE PREFERRED EMBODIMENTS

Figure 1:
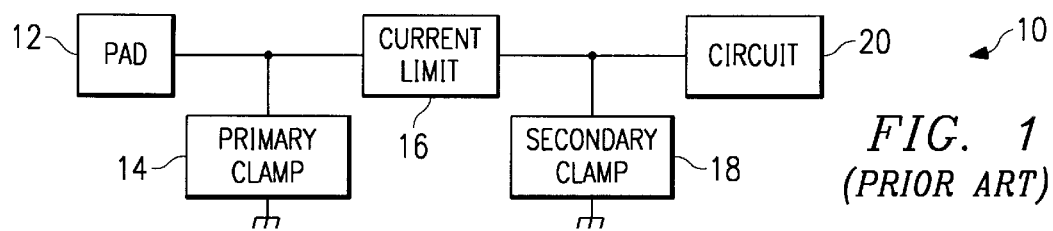
FIG. 1 is a block diagram illustrating a conventional ESD protection circuit.
Figure 2:
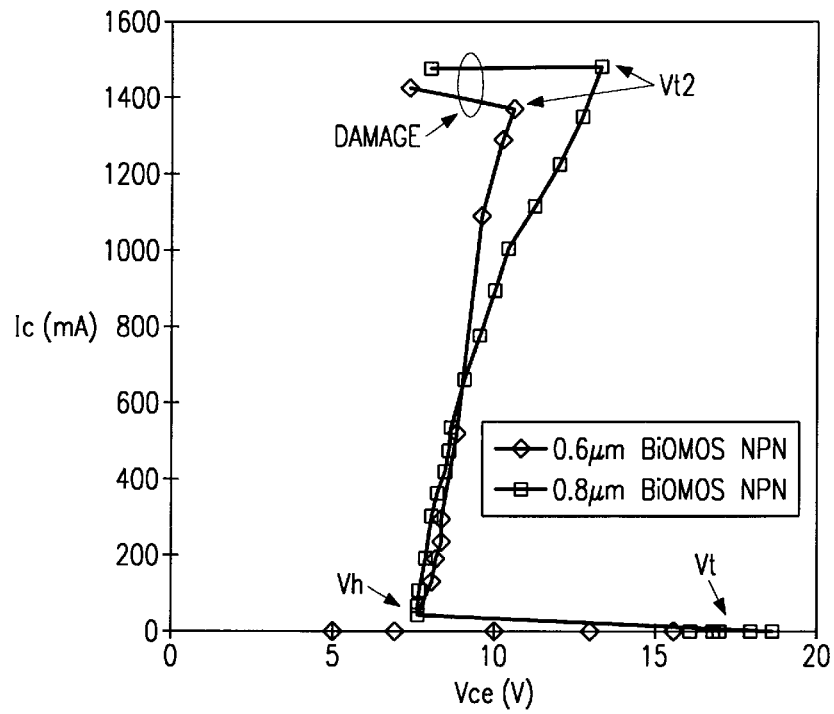
FIG. 2 is a current-voltage graph of 100 $\mu$m wide NPN structures in 0.6 & 0.8 BiCMOS processes.

It is to be understood and appreciated that the process steps and structures described below do not form a complete process flow for the manufacture of integrated circuits. The present invention can be practiced in conjunction with integrated circuit fabrication techniques that are currently used in the art, and only so much of the commonly practiced process steps are included herein as are necessary to provide an understanding of the present invention. The drawing figures that are included with this specification and which represent cross-sections of portions of an integrated circuit during fabrication are not drawn to scale, but instead are drawn so as to illustrate the relevant features of the invention.

The ESD circuit of the present invention provides the relatively low shunt capacitance (typically <0.5 pF) and no appreciable resistance on circuit input and output pads that are desired for the present and future contemplated generations of submicron Bipolar/BiCMOS circuit protection schemes. ESD protection circuits provided in accordance with the present invention are operable to protect the pull-down NMOS transistor in CMOS output buffers, the collector-base junctions in NPN output transistors, and the emitter-base junctions in ECL outputs. Such ESD protection circuitry is operable to turn-on at voltages that are typically below the trigger voltages of these respective elements, and feature a holding voltage that is lower than the turn-on or activation voltages of these devices. As will be explained below, the reduction in turn-on and holding voltages is obtained through the operation of trigger elements that can optionally be integrated with the BSCR to form a protection circuit.

Figure 3A:
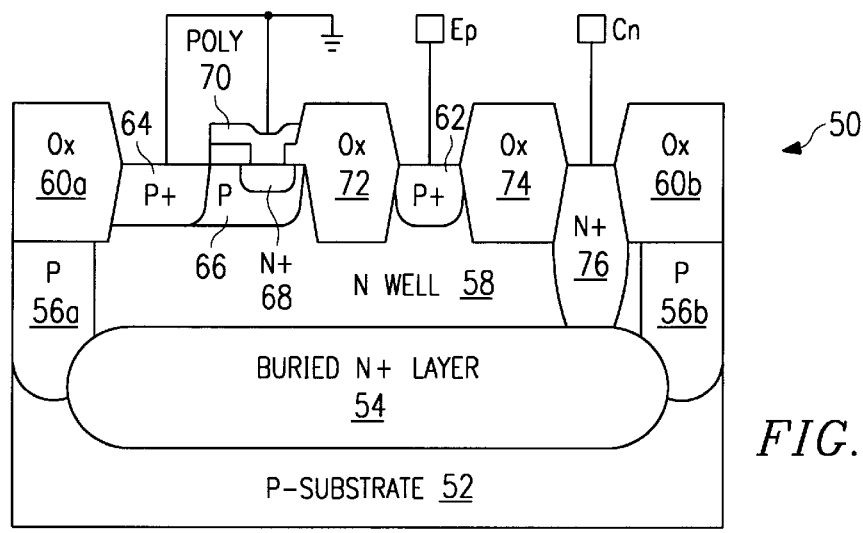
FIGS. 3A and 3B are cross-sections of alternative ESD protection circuit structures in accordance with the present invention.
Figure 3B:
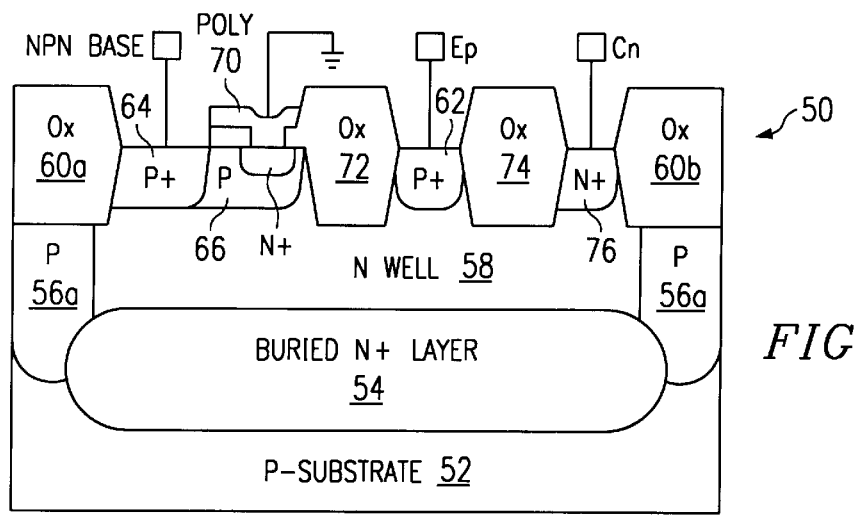

With reference to FIGS. 3A & 3B, there is illustrated in cross-section an exemplary 100 $\mu$m-wide Bipolar SCR ("BSCR"), designated generally by reference numeral 50, that was fabricated in an 0.8 $\mu$m BiCMOS process. The circuit 50 in comprised of an P-substrate 52 which underlies a buried $N^+$ layer 54. The buried $N^+$ layer 54 provides a low collector resistance for a vertical NPN transistor that will be assembled on the structure, as detailed below. The buried $N^+$ layer 54 is surrounded at its ends by P layers 56A and 56B, respectively, which also border the P-substrate 52. The P layers 56A & 56B extend towards the surface structure 50 so as to define an isolation region therebetween in which an N-well 58 is formed. As will be discussed below, the N-well serves as the NPN transistor collector region. Oxide layers 60A and 60B are developed in a conventional manner over P-layers 56A & 56B, respectively. A $P^+$ anode diffusion layer 62 is formed during the course of base $P^+$ implant 64 that is formed in a shallow P-base implant region 66. A shallow $N^+$ region 68 is formed in the P-base 66 and is covered by a layer of polysilicon 70. An oxide layer 72 is developed between the P-base 66 and $P^+$ anode 62. Likewise, an oxide layer is developed between the $P^+$ anode 62 and an $N^+$ region 76 that extends from the surface of the structure 50 and into the N-well 58, thereby serving as the NPN base contact.

Figure 4:
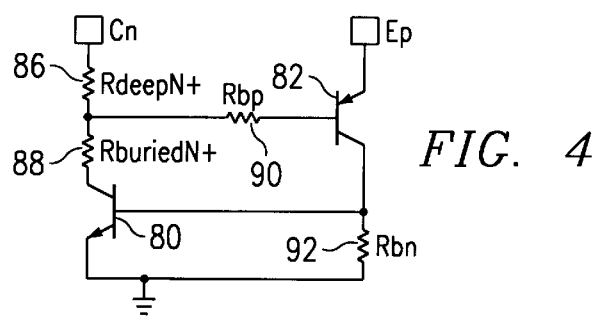
FIG. 4 is a schematic illustration of the ESD protection circuit depicted in FIG. 3A.

The diffusion of the $P^+$ anode 62 occurs during the course of the $P^+$ base implant 64 and is formed in the NPN transistor N-well 58 to form an PNPN SCR structure. This $P^+$ anode implant is advantageous, because it does not require additional masking incident to the process. The PNPN structure is defined by $P^+$ anode 62, N-well 58, P-base 66 and $N^+$ region 68. This Bipolar PNPN structure can be treated as an NPN (80) and PNP (82) transistor pair, and its representative schematic is depicted in FIG. 4. The PNP transistor 82 is represented by the $P^+$ anode 62, N-well 58 and P-base 66. The NPN transistor 80 is represented by the N- well region 68, P base 66 and the $N^+$ poly-emitter 68. Polysilicon layer 70 is an emitter layer which allows for formation the shallow $N^+$ region 68 by diffusion. $N^+$ region 76 serves as the NPN collector contact. $P^+$ region 62 serves as the SCR anode.

Figure 5:
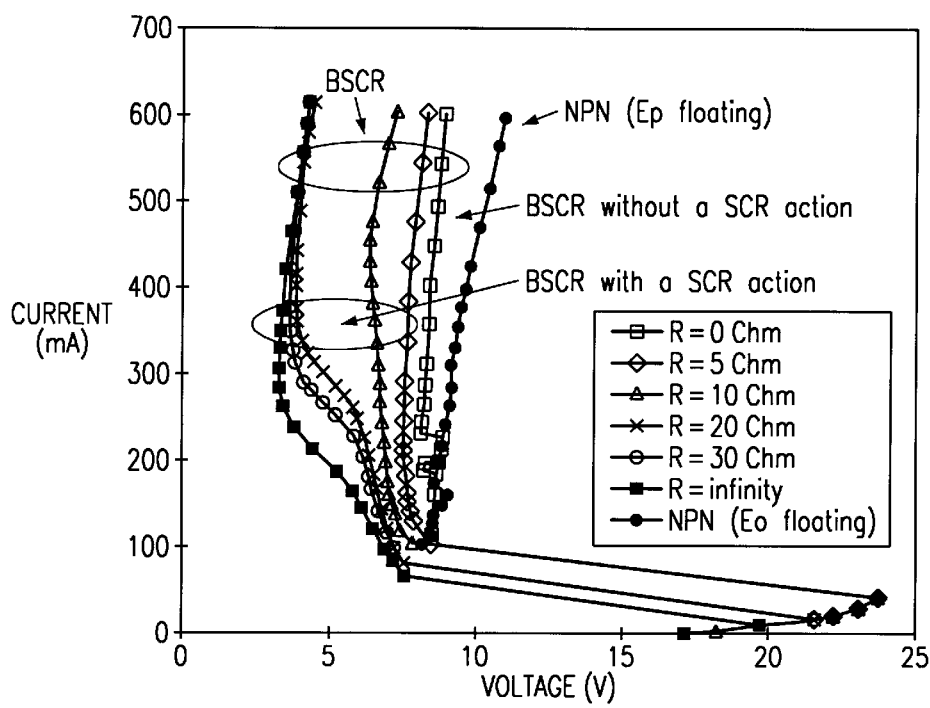
FIG. 5 is a graph of Resistor-dependent current-voltage curves for the Bipolar SCR device depicted in FIG. 3A.

With concurrent reference to FIGS. 3 and 4, the shallow $P^+$ base 64 serves both as a base for NPN transistor 80 as well as the collector of PNP transistor 82. Polysilicon region 70 and underlying $N^+$ region 68 constitute the emitter for NPN transistor 80. $P^+$ anode 62 serves as the emitter for PNP transistor 82. $N^+$ region 76 serves as the collector contact for the NPN transistor 80. With particular reference to the circuit schematic of FIG. 4, $R_{N\text{-}well}$ is the resistor for the N-well 58, $R_{buried}$ $N^+$ is the buried $N^+$ layer resistor 88, $R_{op}$ is the base resistor of the PNP 90 of the PNP transistor, and $R_{on}$ is the base resistor 92 of the NPN transistor 80. In instances where the Collector ($C_{NPN}$) is shored to the Emitter$_{PNP}$ $E_p$, as is typical in conventional SCR configurations, the trigger voltage $V_t$ is about 24 volts, as illustrated in FIG. 5. Such high trigger voltages require the use of a protection circuit that exhibits both a secondary ESD protection device and a series resistor, as is typical with conventional SCR circuits. However, the requirement for addition of a series resistor in the signal path precludes the use of such SCR circuitry in high speed submicron Bipolar/BiCMOS circuit applications. FIG. 5 also illustrates that when the Collector $C_{NPN}$ is shorted to the emitter $E_{PNP}$, the Bipolar SCR is provided with the same 7 Volt $BV_{ceo}$ holding voltage as that of a conventional NPN transistor, with the exception of having the lower on-resistance value paired with the on-resistance value of the NPN transistor, as shown in FIG. 5. Accordingly, the illustrated Bipolar SCR configuration shows little improvement over conventional NPN transistors in terms of trigger ($V_t$) holding ($V_h$) voltages.

Although both the NPN 80 and PNP 82 transistors are "turned on" to provide a low on-resistance, the high $BV_{ceo}$ holding voltage indicates that there is no regenerative SCR action. The turn-on of the regenerative SCR requires that the PNP transistor 82 be biased by the NPN transistor 80 collector current, and vice versa. In the case of the NPN Collector ($C_{NPN}$) shorted to the PNP emitter ($E_{PNP}$), low base-emitter resistance of the PNP transistor 82 due to the low deep $N^+$ diffusion resistance $R_{deep\ N}{}^+$. This requires an additional current from the avalanching NPN collector-base junction to maintain the PNP transistor in the "on" state. For the same given current, increasing the emitter-base resistance in either of the NPN 80 or PNP 82 transistors will increase the base-emitter voltage $V_{be}$ and, as a result, a greater collector current flows into the bipolar transistor. The larger collector current in the bipolars will eliminate the need for an additional current source from avalanche generation, allowing for the occurrence of regenerative SCR action. Hence, holding voltage can be reduced from $BV_{ceo}$ to a lower value. For a given current, higher resistance will permit either of the NPN 80 or PNP 82 transistors to "turn on" more vigorously, resulting in a lower holding voltage $V_h$. This resistor-enhancement effect by an external PNP base-emitter resistor 90 (FIG. 4) between the NPN collector and PNP emitter is illustrated in FIG. 5. Moreover, holding voltage ($V_h$) decreases with increases in resistance (R).

As has been discussed previously, there exist two basic requirements for establishment of a desirable Bipolar SCR protection circuit. One is a low trigger voltage ($V_t$), and the other is a low holding voltage ($V_h$) resulting from a regenerative SCR action. By virtue of the Bipolar SCR design structure and circuit respectively depicted in FIGS. 3 and 4, the base of the NPN transistor 80 can be externally biased. As such, this external bias provides an additional means to control the BSCR through operation of the NPN transistor 80. As has been mentioned previously, the principal concern with using a Bipolar SCR is that the BSCR does not show any significant benefit over use of an NPN transistor, in terms of triggering ($V_t$) and holding ($V_h$) voltages. The principal reason for the holding voltage being substantially similar between the BSCR and NPN transistor is that the Collector-base avalanche breakdown is required to maintain the PNP transistor 82 in the "on" state. Although, both the NPN and PNP transistors are "turned on", thereby providing a low on-resistance in the circuit, there is no regenerative SCR action in the absence of added current flow from the avalanching collector base junction. In order to lower the holding voltage, it is required that the NPN be turned on "harder", thereby providing more current through the N-well resistor ($R_N$ well) to raise the base-emitter voltage of the PNP 82 and thereby turn the PNP on "harder". This can be achieved by increasing the base-emitter resistance ($R_{be}$). Current forced through the base-emitter resistor will then forward-bias the NPN transistor 80 and enable the transistor 80 to turn "on" in the absence of the collector-base avalanching. NPN transistor activation in this manner reduces the trigger voltage $V_t$. A further aspect of the present invention provides a Zener diode to facilitate current biasing, as will be explained below in connection with the circuit diagram illustrated in FIG. 6.

Figure 6:
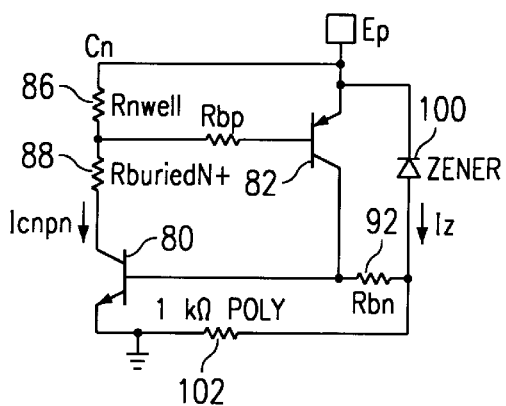
FIG. 6 is a schematic illustration of an alternative Bipolar SCR protection circuit employing an NPN Zener diode and a resistor.

With reference to FIG. 6, there is illustrated a Bipolar SCR ESD protection circuit fabricated in 0.8 μm by BiCMOS technology in accordance with the teachings of the present invention. The illustrated circuit is similar to that illustrated in FIG. 4, with the exception that an NPN Zener diode 100 and a 1K polysilicon resistor 102 are incorporated into the circuit. The Zener diode 100 is formed by the base-emitter junction of the NPN transistor 80 and the emitter of transistor 82. The turn-on voltage of the Zener diode 100 is the NPN base-emitter breakdown voltage, which is required to be slightly higher than the power supply voltages for a given process to ensure that the ESD protection circuit will not be triggered during the course of the normal circuit operation. It may be optionally desirable to provide a forward diode string (not shown) in series with the Zener diode 100 to increase the circuit trigger voltage, particularly for those Zener breakdown voltages that are lower than the power supply voltage. During an ESD event, when the pad voltage exceeds the Zener breakdown voltage, the Zener diode 100 breaks down, and the current flows through the 1K poly resistor 102 to trigger the Bipolar SCR NPN transistor, thereby turning "on" the BSCR to conduct the high ESD current.

Figure 7:
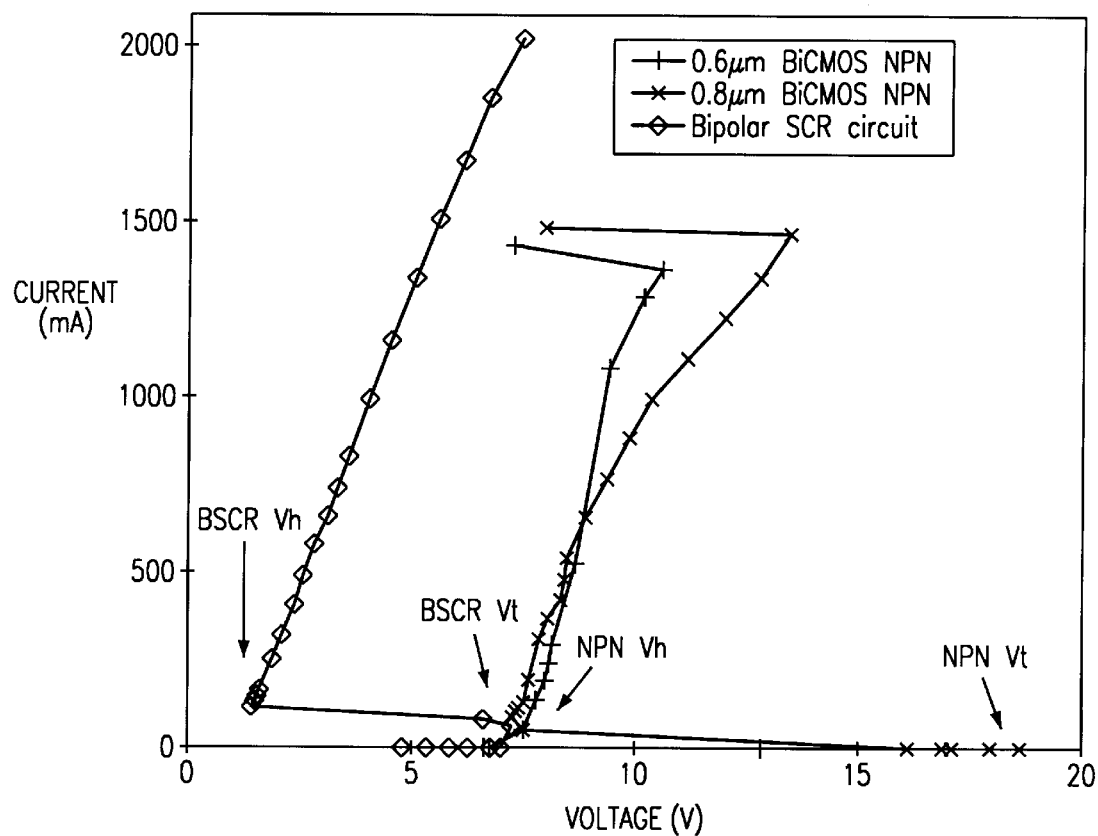
FIG. 7 is a high current-voltage graph of the Bipolar SCR ESD protection circuit illustrated in FIG. 6.

FIG. 7 illustrates a current-voltage graph for the protection circuit illustrated in FIG. 6, for which the deep N+ collector diffusion (N+ region 76 in FIG. 3B) is replaced by a more shallow N+ diffusion that extends into the N-well 58 rather than through the N-well 58 to the deep, buried N+ layer 54 of FIG. 3A. This more shallow diffusion enhances SCR action by increasing the base-emitter resistance of the PNP transistor 82.

FIG. 7 clearly demonstrates that the trigger voltage ($V_t$) can be lowered to 7 V and the holding voltage ($V_h$) can be lowered to ~1.7 V. The circuit can also handle up to 2 amps ESD current while the clamp voltage is maintained at only ~7 V. Under an ESD test, the foregoing circuit with a 100 μm wide BSCR exhibits a 6.7 kV ESD threshold voltage and a 3.2 V/μm² ESD efficiency (as measured in ESD volt as per unit of protection circuit area). In contrast, the NPN transistor manufactured in a substantially similar process exhibits only a 2.3 V/μm² efficiency. Thus, a nearly 40% ESD efficiency gain is achieved by virtue of the construction of the present invention. Stated differently, the Bipolar SCR circuit of the present invention allows for a 40% capacitance load reduction for a given ESD threshold voltage. Moreover, as is shown in the current voltage graph of FIG. 7, the circuit can handle up to about 2 amp ESD current without any damage. At 2 amps, the clamp voltage is about 7 V. In contrast, the holding and trigger voltages for an NPN transistor fabricated in a similar process are both respectively considerably higher, at about 8 and 18 volts, respectively. It can thus be appreciated that the voltage reduction levels describe above afford a considerably greater level of circuit protection than has heretofore been obtainable.

While the invention has been described with reference to illustrative embodiments, the description is not intended to be construed in a limiting sense. Various other embodiments of the invention will be apparent to the person skilled in the art upon reference to this description. It is therefore contemplated that the appended claims will cover any such modifications of he embodiments as fall within the scope and spirit of the invention.

What is claimed is:

1. A structure protecting a circuit from electrostatic discharge comprising:

a first semiconductor layer formed from a semiconductor material of a first conductivity type;

a second semiconductor layer overlying at least a portion of said first semiconductor layer, said second semiconductor layer being formed from a material having a conductivity type opposite that of said first semiconductor layer;

a third semiconductor layer at least partially overlying said second semiconductor layer, said third semiconductor layer having a conductivity type similar to that of said second semiconductor layer;

at least two laterally spaced first implant regions positioned adjacent to said third semiconductor layer, said implant regions having a common conductivity type;

second implant region interposed between said at least two first implant regions;

a third implant region contacting at least a portion of said second implant region and having a conductivity type opposite that of said second implant region; and a fourth implant region laterally spaced from said third implant region and having a common conductivity type as said second implant region, said first and third implant regions, along with said third semiconductor layer defining a bipolar silicon controlled rectifier, one of said first implant regions serving as an anode for said silicon controlled rectifier and the other of said first implant regions serving as a base for an npn transistor and a collector for a pnp transistor.

2. A structure protecting a circuit from electrostatic discharge, comprising:

a first semiconductor layer formed from a semiconductor material of a first conductivity type;

a second semiconductor layer overlying at least a portion of said first semiconductor layer, said second semiconductor layer being formed from a material having a conductivity type opposite that of said first semiconductor layer;

a third semiconductor layer at least partially overlying said second semiconductor layer, said third semiconductor layer having a conductivity type similar to that of said second semiconductor layer 58;

at least two laterally spaced first implant regions positioned adjacent to said third semiconductor layer 58, said implant regions having a common conductivity type;

a second implant region interposed between said at least two first implant regions;

a third implant region contacting at least a portion of said second implant region and having a conductivity type opposite that of said second implant region;

a fourth implant region laterally spaced from said third implant region and having a common conductivity type as said second implant region, wherein one of said first implant regions serves as an anode for said silicon controlled rectifier and the other of said first implant regions serves as a base for an npn transistor and as a collector for a pnp transistor; and a current biasing device incorporated into one of said transistors, said current biasing device comprising a zener diode that is connected to a baseemitter junction of said npn transistor.

3. The structure according to claim 1, wherein said third implant region comprises an emitter for said npn transistor.

4. The structure according to claim 1, further comprising a resistor connected to said pnp transistor.

5. The structure according to claim 4, wherein said resistor is connected between a collector of said npn transistor and an emitter of said pnp transistor.

6. The structure according to claim 1, further comprising a current biasing device in electrical communication with said npn transistor.

7. The structure according to claim 6, wherein said current biasing device comprises a Zener diode.

8. The structure according to claim 7, further comprising a resistor connected to said Zener diode.

9. The structure according to claim 7, further said Zener diode is formed at a base-emitter junction of said npn transistor.

10. The structure according to claim 6, further comprising a forward diode string connected to said current biasing device.

11. The structure according to claim 2, wherein said current biasing device comprises a Zener diode that is formed at a base-emitter junction of said npn transistor, further comprising a resistor connected in series to said Zener diode.

* * * * *